Figure 1:
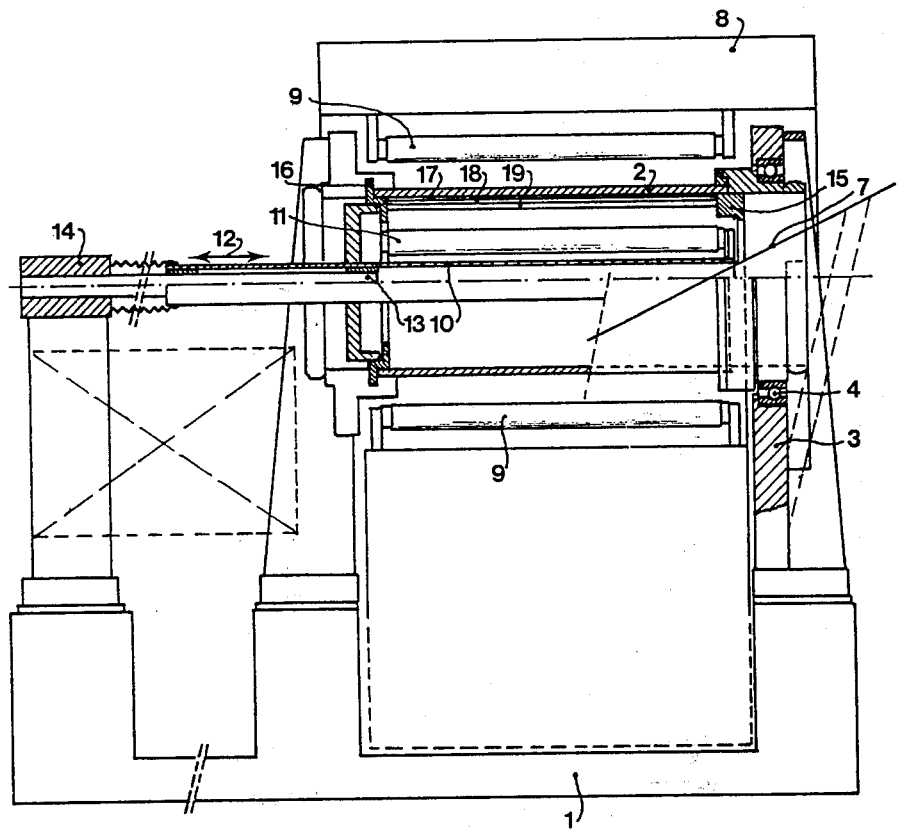

United States Patent [19]

Schoute

[11] 4,304,842
[45] Dec. 8, 1981

[54] PROCESS AND APPARATUS FOR THE MANUFACTURE OF A RELIEF PRINTING FORM AND THE PRINTING FORM THUS MANUFACTURED

[75] Inventor: Johannes C. Schoute, AM Bergen op Zoom, Netherlands

[73] Assignee: Akzo N.V., Arnhem, Netherlands

[21] Appl. No.: 55,304

[22] Filed: Jul. 6, 1979

[30] Foreign Application Priority Data

Jul. 10, 1978 [NL] Netherlands ........................ 7807399

[51] Int. Cl.³ ........................... G03F 7/02; B41C 1/02
[52] U.S. Cl. .................................... 430/306; 430/300; 430/307; 430/327; 101/401.1; 355/47; 355/48; 355/85; 355/104; 355/108; 355/110
[58] Field of Search ............... 430/300, 306, 307, 327; 101/401.1; 355/47, 48, 85, 104, 108, 110

[56] References Cited

U.S. PATENT DOCUMENTS 3,283,714 11/1966 Carpenter ........................ 101/401.1
3,294,889 12/1966 Downie et al. ...................... 264/255
3,615,462 10/1971 Szegho et al. ........................ 430/24
3,615,470 10/1971 Singletary ........................... 355/1 X

FOREIGN PATENT DOCUMENTS 1077818 8/1967 United Kingdom .
1403608 8/1975 United Kingdom .

Primary Examiner—Mary F. Downey
Attorney, Agent, or Firm—Stevens, Davis, Miller & Mosher

[57] ABSTRACT

A process is provided for making a relief printing form which is at least partially cylindrical from a liquid photopolymerizable molding material. In accordance with the process, a molding material is spread over the internal surface of the cylindrical wall by centrifugal force and hardened in the desired places with ultraviolet light to form an image corresponding to a printing design. The nonhardened portions of the molding material are then removed. The cylindrical wall is a transparent cylindrical tube. An exchangeable image-bearing film is placed on the inside of the tube.

Photopolymerizing radiation of the printing form material is effected during rotation of the transparent cylindrial tube. An exchangeable image-bearing film is placed on the inside of the tube. Photopolymerizing radiation of the printing form material is effected during rotation of the transparent cylinder by means of one or more radiation sources distributed around the circumference of the transparent cylinder. The rays act on the molding material via the wall of the transparent cylinder and the image-bearing film. The radiation for hardening the printing form takes place in a continuous operation following the application of the molding material to the cylindrical wall by centrifugal force.

12 Claims, 2 Drawing Figures

PROCESS AND APPARATUS FOR THE MANUFACTURE OF A RELIEF PRINTING FORM AND THE PRINTING FORM THUS MANUFACTURED

This invention relates to a process for the manufacture of a wholly or partially cylindrical relief printing form from a liquid photopolymerizable molding material and to the resulting product.

In the known processes of manufacturing cylindrical printing forms from a flexible material, generally a flat plate is first made from a synthetic resin. This plate is hardened in selected places corresponding to the printing design by photopolymerization. The resulting flexible flat plate is subsequently curved and mounted on a metal printing cylinder. Although with these known processes, reasonably satisfactory results may be obtained for certain uses, they are found to be less than suitable for the manufacture of cylindrical printing forms for printing matter which is to satisfy the present-day high quality demands.

An object of the present invention is to provide an improved process for manufacturing cylindrical printing forms from a liquid photopolymerizable molding material. Another object of the invention is to provide a method of making cylindrical relief printing forms in an efficient way from a photopolymerizable material which meets the present-day high quality demands of flexographic printing matter especially multicolor printing.

Figure 2:
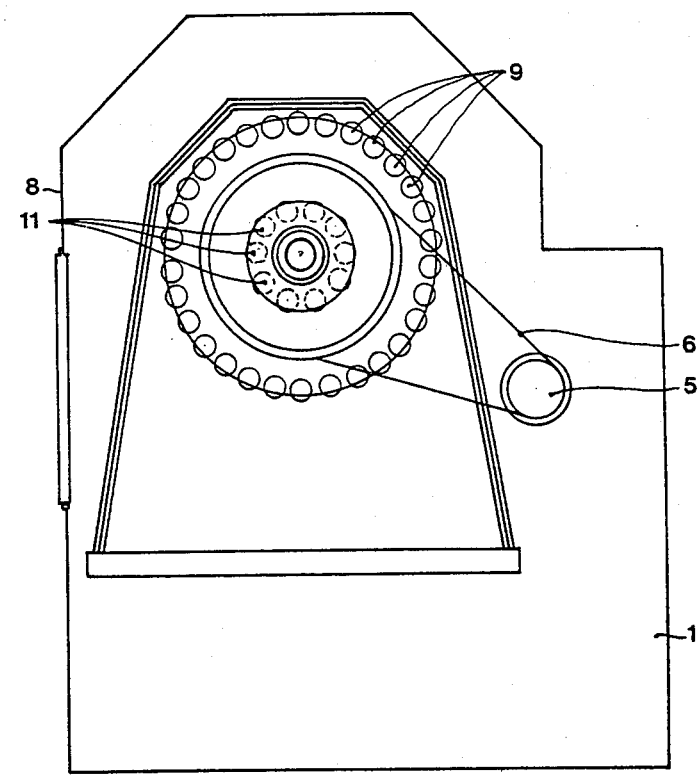

Other objects will become apparent from the following description with reference to the accompanying drawing wherein FIG. 1 illustrates partially in a longitudinal section one embodiment of the apparatus of the invention; and FIG. 2 is a cross-section of the embodiment illustrated in FIG. 1.

The process provided by the invention is characterized in that during rotation the molding material is spread over the internal surface of a cylindrical wall by centrifugal force and hardened in selected places by means of ultraviolet rays to form an image corresponding to a printing design, after which in the nonhardened places the molding material is at least partially removed.

The invention is further characterized in that the cylindrical wall is transparent. Preferably the cylindrical tube is glass. An exchangeable image-bearing film having a smooth surface is placed on the inside surface of the tube. Photopolymerizing radiation of the printing form material is effected during rotation of the transparent cylinder by means of one or more radiation sources distributed around the circumference of the transparent cylinder, the rays of which act on the molding material via the wall of the transparent cylinder and the image-bearing film. The radiation for hardening the printing form takes place in a continuous operation following the application of the molding material to the cylindrical wall by centrifugal force. Generally a photographic negative is used for the image. High operating speed and particularly a satisfactory pre-polymerization of the printing form may be obtained according to the invention if after the molding material has been applied to the inside of the cylindrical wall by centrifugal force, the molding material is also exposed to direct or indirect radiation from one or more radiation sources on the inside of the rotating cylindrical tube. Favorable results may be obtained by the process according to the invention if the transparent cylinder pervious to UV-radiation is so machined internally that both in the radial and in the axial direction it does not deviate more than plus or minus 0.1 mm from the desired form of the cylinder relative to the axis of rotation thereof, and preferably not more than plus or minus 0.02 mm. According to a preferred embodiment of the process of the invention, a transparent cylindrical tube having an inside diameter between 100 mm and 600 mm, a wall thickness of 5 to 20 mm and a length of 200 to 1000 mm is used. Since in the process of the invention the molding material is spread over the wall by centrifugal force, the occlusion of air in the molding mass will be avoided. The use of a glass cylinder makes it possible to obtain a more accurate layer thickness than can be obtained by some known flat methods. According to the invention, the printing form is made inside of a glass cylindrical tube having a radius of curvature which is practically equal to the radius of curvature of the printing form during the flexographic printing process, which leads to the following advantages over the known flat methods:

1. Deformation of the image as a result of the printing form being bent while mounting it on the printing cylinder is avoided;

2. Owing to the entire or practically entire absence of internal stresses in the material of the printing form while in its curved state on the printing cylinder in the operating situation, the printing form is expected to offer a considerably higher abrasion resistance and also the accuracy of the shape, more particularly the roundness, is favorably influenced;

3. The negatives to be used need not be optically corrected to eliminate the effect of deformations, which is often necessary in the case of using the known flat methods for manufacturing printing forms; and 4. The impression of the printing form which always conforms accurately to the negative making it possible to obtain better fits in color printing.

Generally the advantages to be obtained by the process according to the invention will be greater as the thickness of the printing form increases and the diameter decreases.

According to the invention, it has been found that the image-bearing film can be placed effectively against the inner wall of the transparent cylinder by applying a vacuum. According to the invention, it is also of advantage to use an image-bearing film which on the side of the glass wall is previously provided with a thin adhesive coating. An effective adhesive coating is of the type which does not become active, i.e., becomes sticky, until some influence, such as that of surface pressure, heating, radiation or the like, is exerted on the image-bearing film. The image-bearing film can be used several times if according to the invention prior to the liquid molding material being introduced, the image-bearing film is provided on the radially inward side with a cover film. The invention also provides an apparatus for carrying out the process of the invention, which apparatus includes a framework with one or more radiation sources for hardening the photopolymerizable molding material, and with a rotatable, transparent, cylindrical forming tube provided with a drive, which tube is substantially of glass.

The photopolymerizable material may be any UV-curable mixture into which additives may or may not be incorporated. Suitable examples include unsaturated polyester resins and alkyd resins, unsaturated epoxy resins, polybutadiene resins, unsaturated acrylates, unsaturated urethanes, etc., which may or may not contain additives. Alternatively, mixtures of unsaturated polymers or UV-curable mixtures of polymers and saturated or unsaturated monomeric compounds may be used. Moreover, the UV-curable molding material to be used may or may not contain a photoinitiator, which is usually present in an amount of 0.05 to 10 percent by weight, based on the UV-curable binder. Suitable photoinitiators include aromatic carbonyl compounds such as benzil, benzil dimethyl ketal, acetophenone, substituted acetophenones, thioxanthone and chlorothioxanthone. Also mixtures of photoinitiators may be used.

Ultraviolet rays in the wave length range of 90 to 600 nanometer are contemplated for the above said UV-radiation.

Referring now to FIG. 1 of the drawing, a transparent cylindrical glass tube 2 is horizontally supported in a framework in two upright end pieces 3 by means of bearings 4, which are shown only at one end. The glass tube 2 can be set into rotation by means of a motor 5 having two speeds, e.g., 750 and 1500 revolutions per minute, and a belt transmission 6, (FIG. 2). Optionally, use may be made of a stepless speed transmission. Mounted on one of the end pieces 3 is a feed trough 7 for introducing the liquid molding material into the inside of the glass tube 2. Around the glass tube 2 is a bipartite swing-back hood 8 of which in this construction the upper half and the lower half each contain fifteen UV-fluorescent tubes 9. A pipe 10 is slideable disposed in the glass tube 2. In this constructions, ten UV-fluorescent tubes 11 are mounted on the pipe 10. The pipe 10 can be axially displaced on a shaft 13 in the directions indicated by an arrow 12 and at the command of control elements, not shown. The shaft 13 is attached to the frame 1 by means of a support 14.

At its two ends, the glass tube 2 is provided with annular covers 15 and 16 to keep the liquid molding material within the glass tube. Provided on the frame 1, which may be made up of box beams, there are besides the end pieces 3, the hood 8 and the support 14, several switches, pilot lights, etc.

In the manufacture of an entirely or partially cylindrical printing form by the process according to the invention, the pipe 10 with UV-tubes 11 is first axially moved out of the glass tube 2. Next, an image-bearing film 17 is placed against the inside wall of the glass tube 2, after which a cover film 18 is placed on the image-bearing film 17. Subsequently, the image-bearing film 17 and the cover film 18 are pressed against the cylindrical inner wall of the glass tube 2 while applying a vacuum. If desired, the inner surface of the glass tube 2 may be provided with one or more axial and/or radial grooves for allowing the escape of air, which may be of advantage irrespective of whether or not a vacuum is applied.

After the covers 15 and 16 have been installed, a measured amount of liquid molding material is poured onto the inner wall of the glass tube 2. After the liquid has been spread over the wall, the rotary speed of the glass tube 2 is increased by changing over to a higher speed. The feed trough 7 has meanwhile been removed from the glass tube 2 and the liquid molding material has been spread evenly in the form of, for instance, a 3 mm thick skin 19, over the cover film 18 within the glass tube 21 by means of centrifugal force. The pipe 10 with UV-fluorescent tubes is now axially moved into the glass tube 2. Subsequently, the UV radiation is switched on, upon which the molding material 19 is radiated by the internal circle of tubes 11 and the external circle of tubes 9. Radiation of the skin 19 by the external tubes 11 takes place via the, for instance, 9 mm thick wall of the glass tube 2, the image-bearing film 17 and the cover film 18. Depending on the pattern or image to be printed, the image-bearing film 17 is partly pervious and partly impervious to UV light. In the places where the image-bearing film 17 does allow passage of light, the molding material is cured as a result of a polymerization process. In the places where the image-bearing film does not allow the passage of UV light, the molding material is not cured or only cured to a negligible extent. After a few minutes, the molding material has sufficiently hardened in the desired places as a result of prepolymerization. The raditiation is now turned off, the rotation of the glass tube 2 is stopped, the internal circle of UV tubes 11 is placed outside the glass tube 2 and the covers 15 and 16 are removed.

The prepolymerized skin 19 is now removed from the glass tube 2 and placed on a supporting cylinder which may, for instance, be of a metal or plastic material. Subsequently, while supplying a washing liquid, the uncured molding mass is removed from the provisional printing form by brushing or in some other way. Next, the merely prepolymerized printing form is again exposed all around to UV radiation to obtain a sufficiently cured printing form. This postcuring also may be effected by means of electrons or by heat. The resulting printing form may be placed on a matching cylindrical core of the printing machine and is then ready for use in the printing process.

The process and the apparatus according to the invention offer advantages, particularly as far as multicolor printing by the flexographic process is concerned.

It should be added that from the Belgian Patent Publication No. 704 303, a different process of making printing forms is known. In that process during centrifugal casting a kind of matrix is placed in the molding material instead of an image-bearing film, as a result of which the qualilty of the printing form to be made is unfavorably influenced. Moreover, the manufacture of such matrices is relatively costly and laborious.

Mention should also be made of Belgian Patent Publication No. 600 961, which relates to a method for manufacturing forms for a different process, viz. rotogravure printing. In that known method, first a cylinder is made by centrifugal casting a molding material melted by heating. This cylinder is then photosensititzed by subjecting it to a treatment with an aqueous solution of potassium bichromate.

Other patent publications to be mentioned are: CA Pat. No. 612 917, DE No. 1522 359, NL Pat. No. 182 736, U.S. Pat. No. 3,257,944, U.S. Pat. No. 3,496,606, JP Pat. No. 43 702/74 (examined by the Patent Office), GB Pat. No. 1 045 674 and GB Pat. No. 1 114 704. All these patent publications relate to one or more elements, but not all, of the process according to the invention. So far, however, the processes according to these patent publications have not led to such a practical process for the manufacture of printing forms for use in flexographic printing as will satisfy very high requirements as far as quality, accuracy and efficiency are concerned.

Although the invention has been described in detail for the purposes of illustration, it is to be understood that such detail is solely for the purpose of illustration and that variations can be made therein without departing from the spirit and scope of the invention except as it may be limited by the claims.

What is claimed is:

1. In a process for the manufacture of a relief printing form which is at least partially cylindrical from a liquid photopolymerizable molding material which comprises spreading a molding material over the internal surface of the cylindrical wall by centrifugal force, hardening the resulting layer of molding material in selected places by means of ultraviolet rays via an image corresponding to a printing design and removing at least partially remaining nonhardened molding material, the improvement wherein the molding material is spread on a wall of a transparent cylindrical tube to form an exchangeable image-bearing film, and photopolymerization of the printing form material is effected with radiation while rotating the transparent cylinder, said radiation being effected by means of one or more radiation sources distributed around the circumference of the transparent cylinder, the rays of which act on the molding material via the wall of the transparent cylinder and the image-bearing film whereby the radiation for hardening the printing form takes place in a continuous operation following the application of the molding material to the cylindrical wall by centrifugal force.

2. A process according to claim 1, characterized in that after the molding material has been applied to the inside of the cylindrical wall by centrifugal force the molding material is also exposed to direct or indirect ultraviolet radiation from one or more radiation sources on the inside of the rotating cylindrical tube.

3. A process according to claim 1 wherein the transparent cylindrical tube is a glass cylinder.

4. A process according to claim 3 wherein the transparent cylinder is machined internally whereby it deviates not more than plus or minus 0.10 mm from the desired form radially and axially relative to the axis of rotation thereof.

5. A process according to claim 4 wherein said deviation is not more than plus or minus 0.02 mm.

6. the process of claim 4 wherein said transparent tube has an internal diameter in the range of 100 to 600 mm, a wall thickness of 5 to 20 mm and a length of 200 to 1000 mm.

7. The process of claim 1 wherein the said image-bearing film is placed on the inside wall of the transparent cylinder by means of a vacuum.

8. The process of claim 7 wherein said image-bearing film is provided with a thin adhesive coating.

9. The process of claim 8 wherein said adhesive coating is one which does not become active until some influence, such as that of surface pressure, heating or radiation, is exerted on the image-bearing film.

10. The process of claim 1 wherein prior to introduction of the liquid molding material, the image-bearing film is provided on the radially inward side of the cylindrical tube with a cover film.

11. In a method for making a relief printing form which comprises spreading a liquid photopolymerizable molding material over an internal cylindrical surface of a transparent walled cylindrical tube by centrifugal force in a predetermined design, hardening only portions of the resulting film by exposure to ultraviolet light and removing at least a portion of the remaining nonhardened molding material to form a printing design, the steps of photopolymerizing the said resulting film where it is to be hardened by exposing the film to said untraviolet light continuously while rotating the said tube, said ultraviolet light striking said film through the transparent wall of said tube.

12. A process for making a substantially cylindrical relief printing form which comprises spreading by centrifugal force an ultraviolet light curable resinous material over the internal surface of an axially rotatable cylinder having a wall which is transparent to ultraviolet light, passing ultraviolet light through areas of said wall corresponding to a desired printing design to selectively harden areas of the resinous material while rotating the cylinder, and removing resinous material which is not hardened to form a printing pattern, removing the resulting pattern from the wall of the cylinder, and assembling the pattern with a support therefor.

* * * * *